United States Patent [19]
Tokura

[11] Patent Number: 6,121,829
[45] Date of Patent: Sep. 19, 2000

[54] FREQUENCY DEMODULATOR

[75] Inventor: Atsushi Tokura, Tenri, Japan

[73] Assignee: Sharp Kabushiki Kaisha, Osaka, Japan

[21] Appl. No.: 09/300,838

[22] Filed: Apr. 28, 1999

[30] Foreign Application Priority Data

Apr. 30, 1998 [JP] Japan .................................. 10-121546

[51] Int. Cl.⁷ .............................. H03D 3/00; H03D 3/18; H04L 27/14

[52] U.S. Cl. .......................... 329/341; 329/301; 329/303; 329/318; 329/342; 329/343; 375/324; 375/334; 375/345; 455/214; 455/234.1; 455/337

[58] Field of Search ..................................... 329/300–303, 329/318, 319, 321, 341–343; 375/324, 334–337, 345; 455/214, 234.1, 337

[56] References Cited

U.S. PATENT DOCUMENTS

| | | | |
|---|---|---|---|
| 4,839,905 | 6/1989 | Mantovani | ................................. 375/12 |
| 5,430,766 | 7/1995 | Ota et al. | ................................. 375/318 |
| 6,041,084 | 3/2000 | Nagaraj . | |

FOREIGN PATENT DOCUMENTS

| | | |
|---|---|---|
| 6-188638 | 7/1994 | Japan . |
| 11-191741 | 7/1999 | Japan . |

*Primary Examiner*—David Mis

[57] ABSTRACT

A frequency demodulator of the present invention includes: an amplification section for receiving a frequency-modulated signal and amplifying the frequency-modulated signal based on a gain so as to produce a digital signal having a predetermined level and an inverted signal of the digital signal; a digital demodulation section for receiving the digital signal and frequency-demodulating the digital signal; an amplitude detection section for receiving the digital signal and the inverted signal of the digital signal, and detecting maximum amplitude values of the digital signal and the inverted signal for a predetermined period of time so as to produce an amplitude signal in proportion to the maximum values; and a gain controlling section for varying the gain based on the amplitude signal.

5 Claims, 6 Drawing Sheets

FIG.3A Input signal of digital demodulation section 160

FIG.3B Output signal of multiplier 163

FIG.3C Output signal

FREQUENCY DEMODULATOR

BACKGROUND OF THE INVENTION

1. Field of the Invention

The present invention relates to an FM receiving apparatus for use in receiving signals in FM broadcasting or FM communications, and to an apparatus for reproducing a media which carries frequency-modulated signals recorded thereon.

2. Description of the Related Art

Figure 6:
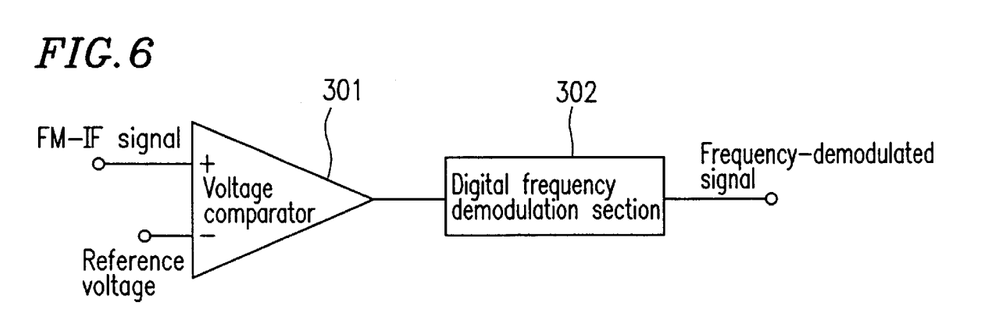
FIG. 6 illustrates a frequency demodulator based on a conventional digital process.

FIG. 6 illustrates a frequency demodulator for demodulating a signal through a conventional digital process. In the conventional digital process, an FM-IF (Frequency Modulation-Intermediate Frequency) signal is converted to a digital signal having two levels, i.e., a digitized FM-IF signal, and the digitized FM-IF signal is FM-detected by a digital frequency demodulation section such as a digital delay detector or a PLL detector.

The frequency demodulator of FIG. 6 includes a voltage comparator 301 and a digital frequency demodulation section 302.

The voltage comparator 301 compares a voltage of an input FM-IF signal with a reference voltage supplied from a voltage source (not shown) whose output voltage is fixed. The voltage comparator 301 outputs an H level digital signal when the voltage of the FM-IF signal is higher than the reference voltage, and an L level digital signal when the voltage of the FM-IF signal is lower than the reference voltage.

The digital frequency demodulation section 302 receives a digital signal from the voltage comparator 301 and outputs an encoded, frequency-demodulated signal.

In particular, in the frequency demodulator of FIG. 6, the input FM-IF signal is compared with the reference voltage by the voltage comparator 301, so as to be converted to a digital signal having two levels, i.e., a digitized FM-IF signal. The digitized FM-IF signal is then frequency-demodulated through the digital signal process by the digital frequency demodulation section 302.

Such a conventional frequency demodulator is disclosed in, for example, Japanese Laid-Open Patent Publication No. 6-188638 and Japanese Patent Application No. 9-358573.

Typically, the voltage comparator 301 of FIG. 6 comprises a differential amplification circuit having a sufficient gain and a modified circuit thereof. These circuits do not include a feedback circuit.

Since the circuits do not include a feedback circuit, there may occur saturation or cut-off of a drain current of the differential amplifier as the amplitude of the input FM-IF signal increases. In the frequency demodulator of FIG. 6, it is difficult to operate the voltage comparator 301 at a high frequency due to an influence of the charge/discharge time of the gate capacitance during a transition between the saturated and unsaturated states.

Where the input voltage is close to the reference voltage, if a noise signal is introduced into the input voltage, hysteresis noise may be output from the voltage comparator 301. When the hysteresis noise is introduced into the FM-IF signal, the frequency demodulation performed by the digital frequency demodulation section 302 may become inaccurate. This problem is more pronounced when the level of the FM-IF signal input to the voltage comparator 301 is low. The above-described problem can be avoided by providing a hysteresis characteristic to the input characteristics of the voltage comparator 301. In such a case, however, a new problem arises in that the input sensitivity is reduced.

SUMMARY OF THE INVENTION

According to one aspect of this invention, a frequency demodulator includes: an amplification section for receiving a frequency-modulated signal and amplifying the frequency-modulated signal based on a gain so as to produce a digital signal having a predetermined level and an inverted signal of the digital signal; a digital demodulation section for receiving the digital signal and frequency-demodulating the digital signal; an amplitude detection section for receiving the digital signal and the inverted signal of the digital signal, and detecting maximum amplitude values of the digital signal and the inverted signal for a predetermined period of time so as to produce an amplitude signal in proportion to the maximum values; and a gain controlling section for varying the gain based on the amplitude signal.

According to another aspect of this invention, a frequency demodulator includes: a differential amplifier for receiving a frequency-modulated signal and amplifying the frequency-modulated signal based on a gain so as to produce a digital signal and an inverted signal of the digital signal; a digital demodulation section for receiving the digital signal and frequency-demodulating the digital signal; an amplitude detection section having a switched capacitor section for detecting the digital signal and the inverted signal, and adding and integrating the signals by means of the switched capacitor section; and a gain controlling section for varying the gain by varying a bias current for the differential amplifier based on the signal obtained through the integration by the amplitude detection section.

In one embodiment of the invention, the digital demodulation section includes: a clock section for generating a clock signal; a delay section for delaying the digital signal in synchronization with the clock signal; a multiplication section for multiplying the digital signal and the delayed digital signal; and a digital filter for removing from the multiplied signal a signal in a band other than a band of the frequency-demodulated signal.

In another embodiment of the invention, the amplification section, the digital demodulation section, the amplitude detection section, and the gain controlling section are all provided on a single semiconductor substrate.

In still another embodiment of the invention, the differential amplifier, the digital demodulation section, the amplitude detection section, and the gain controlling section are all provided on a single semiconductor substrate.

Thus, the invention described herein makes possible the advantage of providing a frequency demodulator which can be operated at a high frequency even when an amplitude of received frequency-modulated signal varies, and in which hysteresis noise is unlikely to be generated even when the received frequency-modulated signal is close to the reference voltage.

This and other advantages of the present invention will become apparent to those skilled in the art upon reading and understanding the following detailed description with reference to the accompanying figures.

A function of the present invention will now be described.

With a frequency demodulator of the present invention, even if the input level of the FM-IF signal varies, the signal level of the digitized FM-IF signal can be kept at a constant level by controlling the gain of the amplification section, without saturating a transistor of an amplification section which would otherwise hinder a high-speed operation. Moreover, a frequency demodulator of the present invention performs linear amplification across the entire input range.

Therefore, even when the input level of the FM-IF signal is low, it is possible to suppress the generation of hysteresis noise in the voltage comparator section, thereby realizing a high-quality frequency demodulation.

DESCRIPTION OF THE PREFERRED EMBODIMENTS

Figure 1:
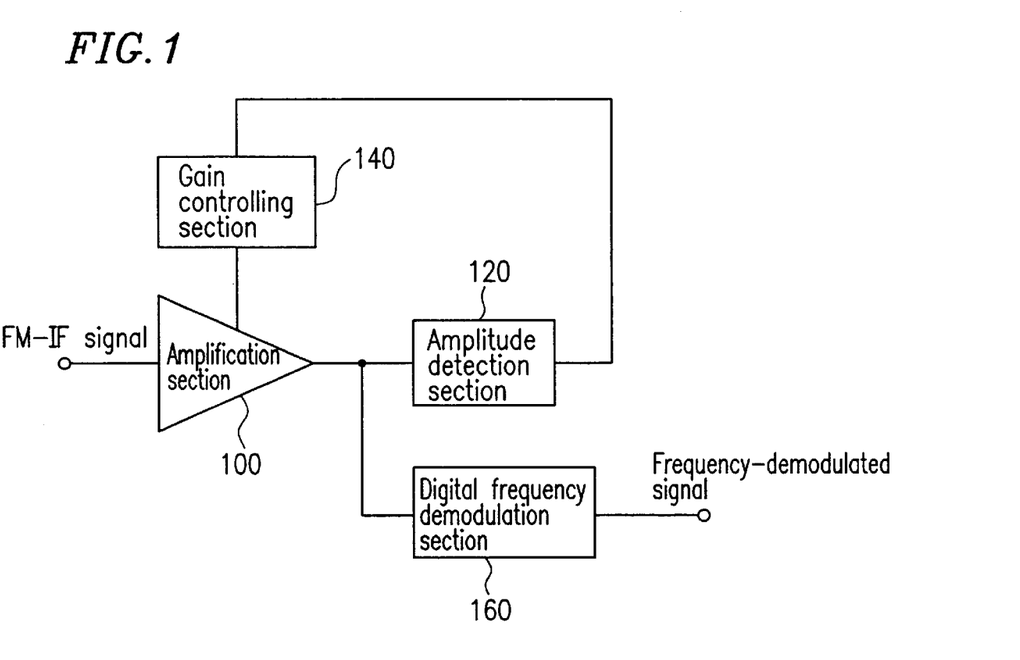
FIG. 1 is a block diagram illustrating a frequency demodulator according to an example of the present invention.

FIG. 1 is a block diagram illustrating a frequency demodulator according to an example of the present invention. An exemplary structure of a frequency demodulator according to the example of the present invention will now be described with reference to FIG. 1.

The frequency demodulator of FIG. 1 includes an amplification section 100, an amplitude detection section 120, a gain controlling section 140, and a digital frequency demodulation section 160.

The amplification section 100 receives an FM-IF signal and amplifies the received FM-IF signal so as to output a digital signal having two levels (i.e., a digitalized FM-IF signal and an inverted signal thereof).

The digital frequency demodulation section 160 frequency-demodulates the FM-IF signal which has been digitalized by the amplification section 100 through a digital signal process so as to output a frequency-demodulated signal.

The amplitude detection section 120 detects the maximum amplitude value of the FM-IF signal which has been digitalized by the amplification section 100 and the inverted signal thereof for a predetermined period of time, so as to output a signal in proportion to the detected maximum value.

The gain controlling section 140 receives the signal output from the amplitude detection section 120 so as to control the gain of the amplification section 100 based on the value of the received signal.

Figure 2:
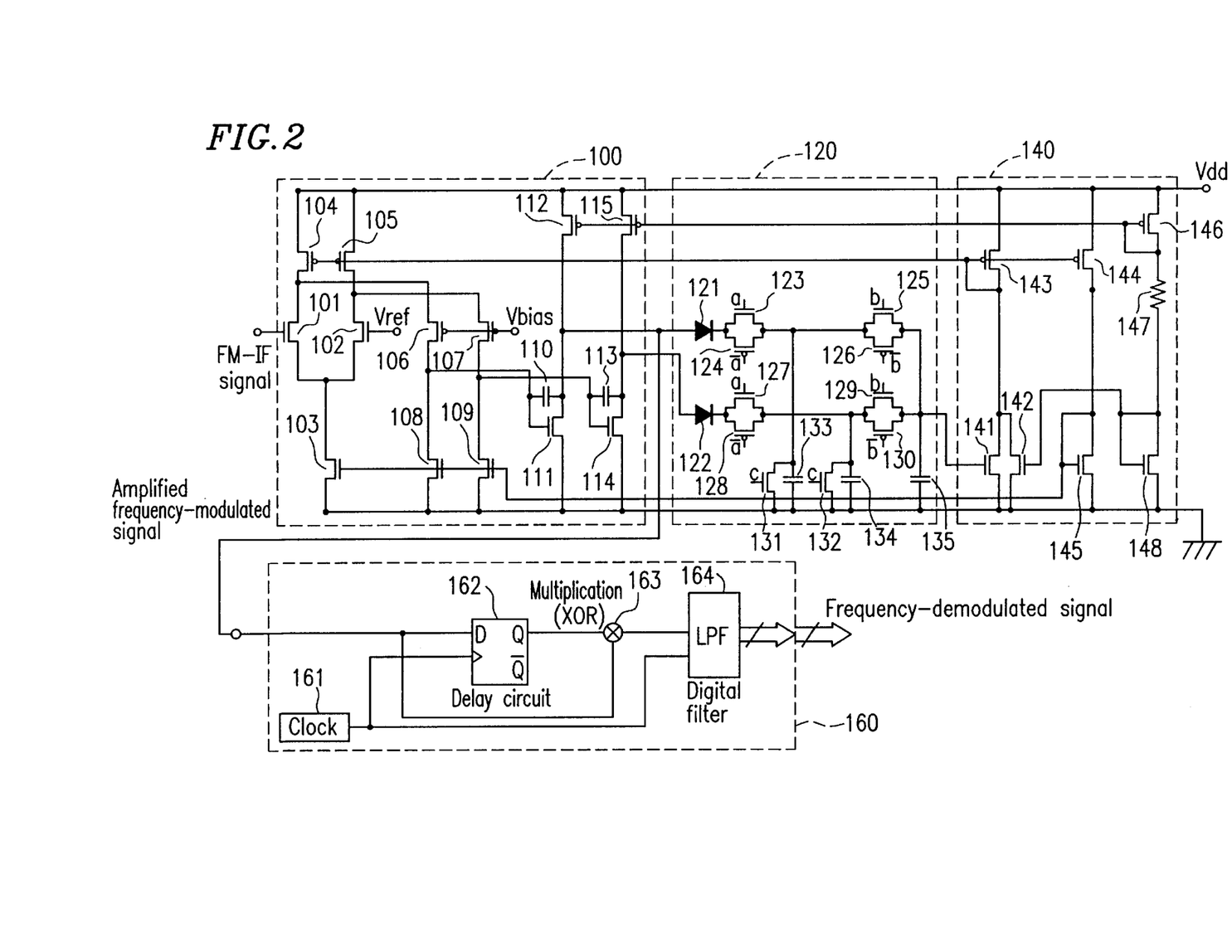
FIG. 2 is a circuit diagram illustrating the frequency demodulator of FIG. 1 in greater detail.

FIG. 2 is a circuit diagram illustrating the frequency demodulator of FIG. 1 in greater detail. An exemplary circuit of a frequency demodulator according to the present example will now be described in greater detail with reference to FIG. 2.

The amplification section 100 of FIG. 2 includes MOS transistors 101–109, 111, 112, 114 and 115, and capacitors 110 and 113.

The MOS transistors 101, 102, 106 and 107 together form a first-stage folded cascode type differential amplifier. The input FM-IF signal is amplified by the MOS transistors 101, 102, 106 and 107.

The MOS transistors 103, 104 and 105 together form a constant current source for conducting a bias current through the MOS transistors of the folded cascode type differential amplifier.

The MOS transistors 108 and 109 together form a constant current source to be a load for the folded cascode type differential amplifier.

The MOS transistors 111 and 114 perform a differential amplification in the next stage so as to output the amplified signal to the amplitude detection section 120 and the digital frequency demodulation section 160.

The MOS transistors 112 and 115 together form a constant current source to be a load for a second-stage differential amplifier.

The capacitors 110 and 113 are provided for compensating the phase of a signal output from the amplification section 100.

The amplitude detection section 120 of FIG. 2 includes diodes 121 and 122, MOS transistors 123–132, and capacitors 133–135.

The diodes 121 and 122 receive output signals from the amplification section 100, and output positive ones of the output signals to the capacitors 133 and 134, respectively. The capacitors 133 and 134 respectively store the maximum values (voltage) of the output signals from the amplification section 100 for the predetermined period of time, and output the stored values to the integration capacitor 135. The integration capacitor 135 integrates and stores the respective signals from the capacitors 133 and 134. The MOS transistors 123–132 together form a MOS analog switch for charging/discharging the capacitors 133–135 so as to perform an addition/integration operation.

The gain controlling section 140 of FIG. 2 includes MOS transistors 141–146 and 148, and a resistor 147.

The MOS transistor 146, together with the MOS transistors 112 and 115, form a current mirror circuit. The MOS transistor 146 generates a bias voltage for conducting through the MOS transistors 112 and 115 a current in proportion to the current flowing through the MOS transistor 146.

The MOS transistors 142 and 148 together form a current mirror circuit. The MOS transistor 148 conducts through the MOS transistor 142 a current in proportion to the current flowing through the MOS transistor 148.

The resistor 147, together with the MOS transistors 146 and 148, form a constant current circuit. The resistor 147 functions to conduct a constant current through the MOS transistors 146 and 148.

The MOS transistor 141 forms a variable current source for supplying a current according to the voltage of the integration capacitor 135.

The MOS transistor 143, together with the MOS transistors 104, 105 and 144, form a current mirror circuit. The MOS transistor 143 supplies a bias voltage for conducting through the MOS transistors 104 and 105 a current in proportion to the sum of the currents respectively flowing through the MOS transistors 141 and 142.

The MOS transistors 144 and 145, together with the MOS transistors 103, 108 and 109, form a current mirror circuit. The MOS transistors 144 and 145 generate a bias current for conducting through the MOS transistors 103, 108 and 109 a current in proportion to the current flowing through the MOS transistor 143.

The digital frequency demodulation section 160 of FIG. 2 includes a clock signal generation section 161, a delay circuit 162, a multiplier 163, and a digital filter 164.

The delay circuit 162 comprises a number of stages of D-type flip flops. The delay circuit 162 stores and delays the FM-IF signal (which has been digitized by the amplification section 100) in synchronization with a clock signal, and outputs the delayed signal.

The multiplier 163 receives the FM-IF signal digitized by the amplification section 100 and the signal delayed by the delay circuit 162. The multiplier 163 XORs the signals, and outputs a resultant signal which contains a frequency-demodulated signal, a frequency-doubled wave of the FM-IF signal, and harmonic thereof.

The digital filter 164 filters the output signals from the multiplier 163 so as to extract and output only the frequency-demodulated signals.

The clock signal generation section 161 outputs, to the delay circuit 162 and the digital filter 164, a clock signal based on which the frequency demodulator is operated.

A frequency demodulation operation of the frequency demodulator of the present example will now be described with reference to FIGS. 3A to 3C.

Figure 3A:
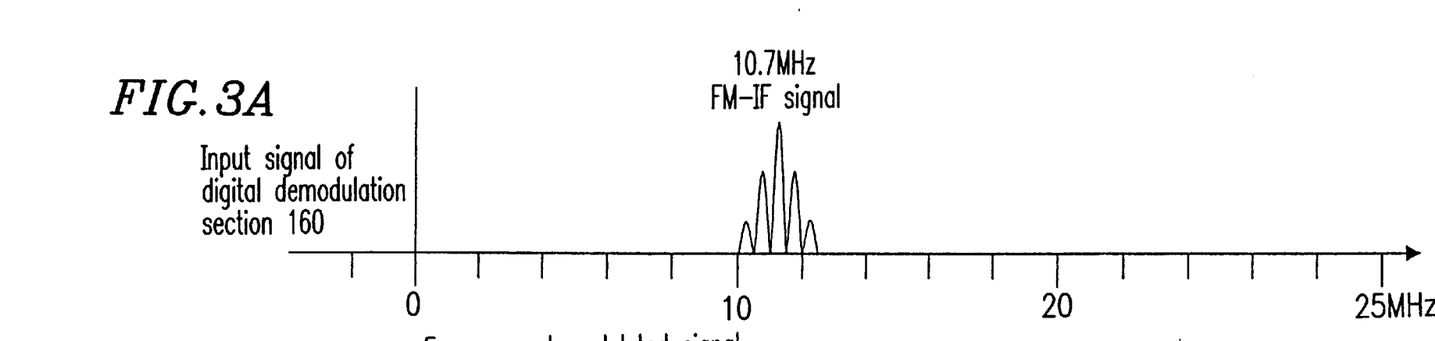
FIG. 3A illustrates a digitized FM-IF signal received by a digital frequency demodulation section 160.
Figure 3B:
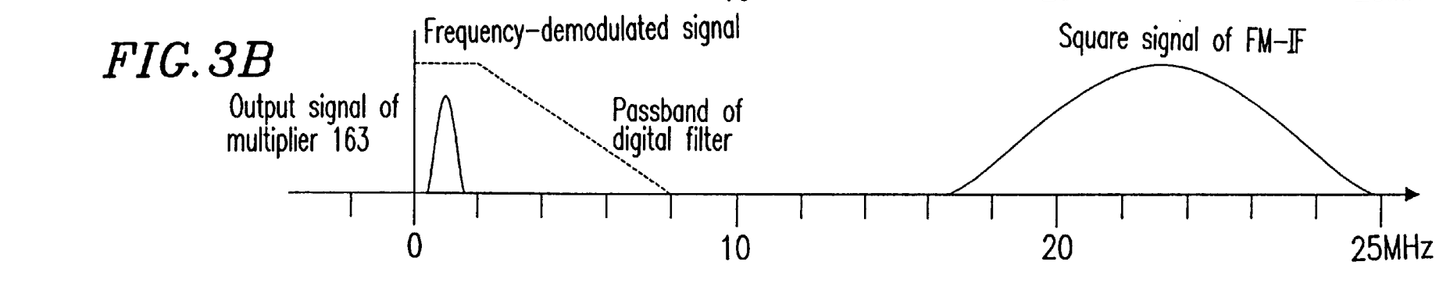
FIG. 3B illustrates a spectrum of a mixed signal.
Figure 3C:
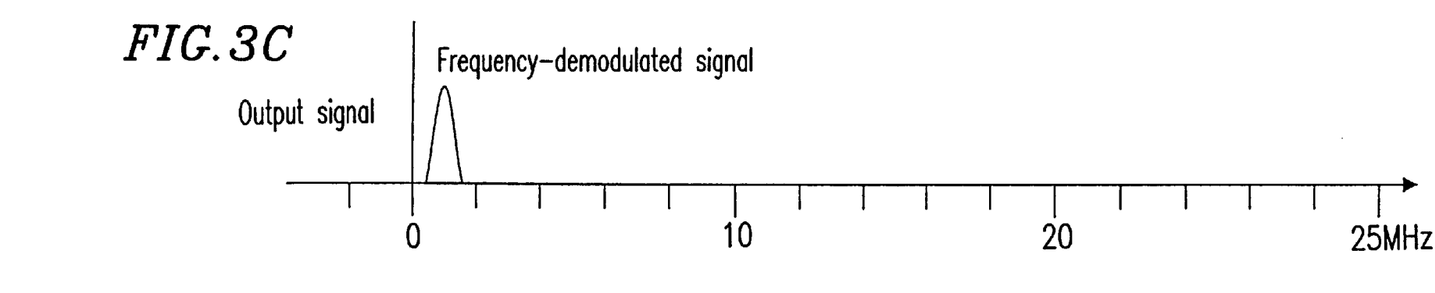
FIG. 3C illustrates a signal having passed through a digital filter 164.

FIG. 3A illustrates a digitalized FM-IF signal received by the digital frequency demodulation section 160. The "digitalized FM-IF signal" as used herein refers to a signal which has been amplified, to a digital signal level, by a differential amplifier whose first-stage comprises a folded cascode (e.g., the amplification section 100). Such a digitalized signal is considered to be a digitized FM-IF signal. The digitized FM-IF signal contains a fundamental frequency component identical to the FM-IF signal. In the present example of the invention, the frequency of the FM-IF signal is set to about 10.7 MHz, which is typically employed in the art. However, it is understood that the frequency demodulator of the present invention can also be used with an FM-IF signal of any other frequency.

The digitized FM-IF signal is sent to the amplitude detection section 120 and the digital frequency demodulation section 160.

The digital frequency demodulation section 160 diverges the digitized FM-IF signal into two flows. One of the flows directly goes to the multiplier 163, and the other one of the flows goes to the delay circuit 162, where the digitized FM-IF signal is delayed by a predetermined period and then output to the multiplier 163.

The delay circuit 162 delays the digitized FM-IF signal by sampling the digitized FM-IF signal at a sampling rate which is more than twice as much as the frequency of the FM-IF signal.

Then, the multiplier 163 performs a square-law detection by multiplying the digitized FM-IF signal by the delayed signal, thereby generating a signal in which a digitized frequency-demodulated signal is mixed with harmonic component of the digitized FM-IF signal. FIG. 3B illustrates a spectrum of the mixed signal.

Then, the mixed signal is filtered by the digital filter 164. FIG. 3B shows, in a dotted line, a characteristic of a passband of the digital filter 164. FIG. 3C illustrates a signal having passed through the digital filter 164.

An operation of the amplification section 100 of FIG. 2 will now be described.

As the voltage at the FM-IF signal input terminal of the amplification section 100 increases, the drain current of the MOS transistor 101 increases. The drain of the MOS transistor 101 is connected to the source of the MOS transistor 106. The drain of the MOS transistor 101 is also connected to the drain of the MOS transistor 104 (which forms a constant current source), whereby the drain current of the MOS transistor 106 decreases by the increment in the drain current of the MOS transistor 101. Due to the decrease in the current, the drain-source voltage of the MOS transistor 108 (a current source) decreases. The amplifier comprising the MOS transistors 111 and 112 at the next stage amplifies and outputs the change in the drain-source voltage.

The MOS transistors 102, 107, 114 and 115 which respectively form transistor pairs with the MOS transistors 101, 106, 111 and 112 (i.e., the MOS transistors on the other side of the differential amplifier) operate in a manner similar to that described above.

Typically, in a voltage amplifier using a MOS transistor, a drain voltage resulting from a change in the drain current is applied to the gate by a gate-drain capacitance Cgd of the MOS transistor. This serves as a negative feedback, thereby reducing the gain of the transistor in a high-frequency operation.

In the present example of the invention, however, the gate of the MOS transistor 106 is fixed to a constant voltage Vbias, whereby the drain voltage of the MOS transistor 101 is constant regardless of the drain current. Thus, the drain voltage is not fed back by the capacitance Cgd, whereby the gain of the transistor in a high-frequency operation is not reduced by the influence of Cgd, thus allowing for an operation at a higher speed.

Figure 4:
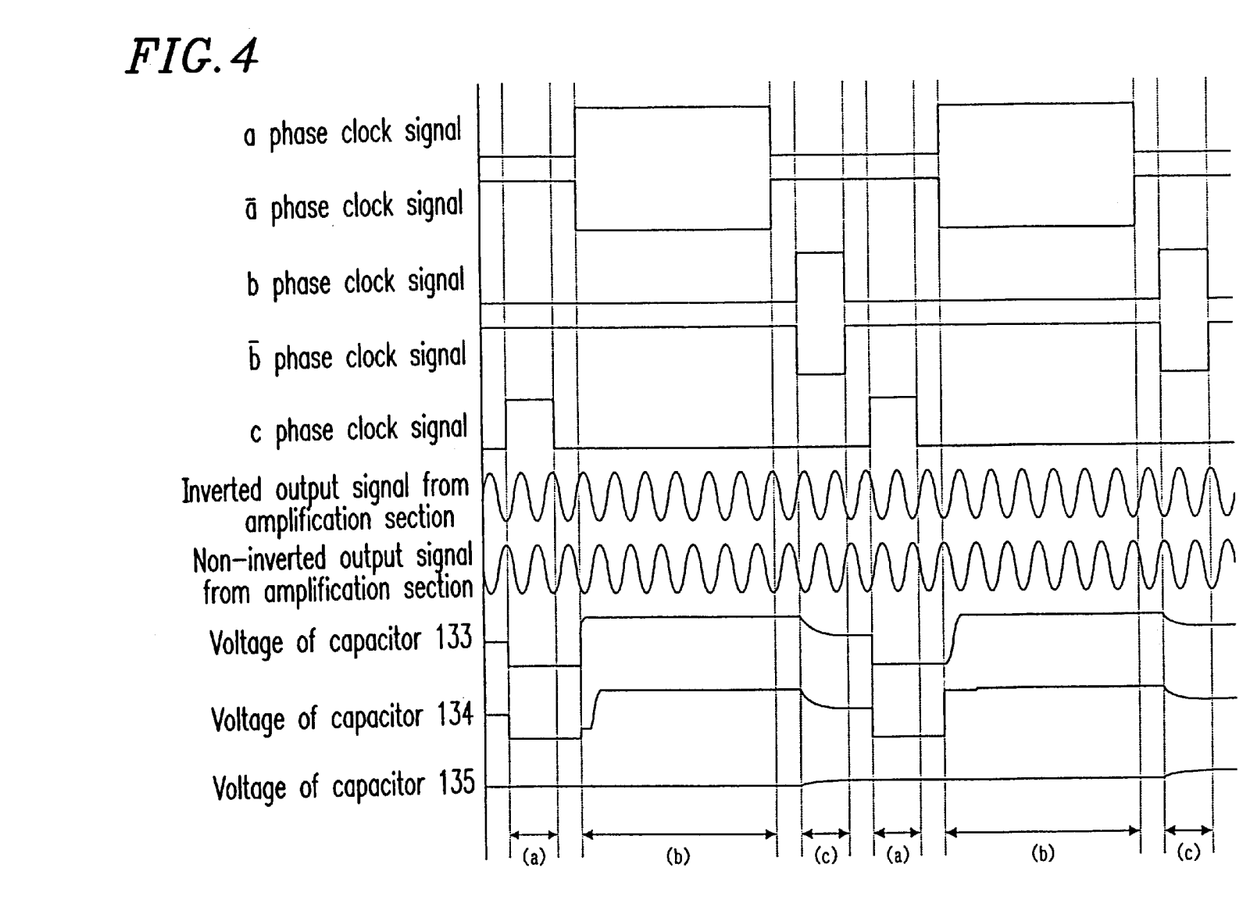
FIG. 4 illustrates voltage waveforms of an amplitude detection section 120.

An operation of the amplitude detection section 120 of FIG. 2 will now be described with reference to FIG. 4. FIG. 4 illustrates voltage waveforms in the amplitude detection section 120.

As described above, the amplitude detection section 120 includes the MOS transistors 123–132. The MOS transistors 123 and 127 receive a clock signal having a phase a, and the MOS transistors 124 and 128 receive a clock signal having a phase /a (in the present specification, the symbol "/" is used in place of an upper bar; e.g., the symbol "/a" represents "a" with an upper bar placed over it as in FIG. 4). The MOS transistors 125 and 129 receive a clock signal having a phase b, and the MOS transistors 126 and 130 receive a clock signal having a phase /b. The MOS transistors 131 and 132 receive a clock signal having a phase c. Each of the MOS transistor serves as a switch.

During a reset period (a) in FIG. 4, the MOS transistors 131 and 132 are turned ON, thereby completely discharging the capacitors 133 and 134. During a charging period (b) in FIG. 4, the MOS transistors 123, 124, 127 and 128 are turned ON. Thus, the capacitors 133 and 134 are charged with an amplifier inverted output signal and/or an amplifier non-inverted output signal from the amplification section 100 via the diodes 121 and 122.

Due to the diodes 121 and 122, the currents, with which the capacitors 133 and 134 are charged, are conducted only in one direction (such as to charge the capacitors). Therefore, even when the non-inverted output signal voltage and/or the inverted output signal voltage from the amplification section 100 decrease, the capacitors 133 and 134 hold the respective maximum voltages which have been applied thereto during the charging period.

During an addition period (c) in FIG. 4, the MOS transistors 125, 126, 129 and 130 are turned ON so as to add the maximum voltage value of the non-inverted output signal stored in the capacitor 133, the maximum voltage value of the inverted output signal stored in the capacitor 134, and the voltage of the integration capacitor 135.

Herein, the FM-IF signal input to the amplification section 100 is represented by "f(t)", the gain of the amplification section 100 by "A", and the input conversion offset voltage by "Voff".

Then, a voltage V added to the integration capacitor 135 can be expressed by the following expression:

$$V = \text{maxim}[A\{f(t)+\text{Voff}\}] + \text{maxim}[-A\{f(t)+\text{Voff}\}]$$
$$= 2A\,\text{maxim}\{f(t)\}$$

As can be seen from the expression, the offset components are cancelled out, whereby the voltage V to be added to the integration capacitor 135 does not contain any offset component. Accordingly, a voltage in proportion to the amplitude of the amplified FM-IF signal is added to the integration capacitor 135. Thus, an integrated value of the voltage in proportion to the amplitude of the amplified FM-IF signal is obtained.

The function of canceling out the offset components is effective in removing an offset component which is generated when the gain controlling section 140 varies the bias current.

The calculation/integration operation can alternatively be implemented by an adder/integrator structure comprising an operational amplifier and a resistor/capacitor. In the present example of the invention, a switched capacitor is used for performing the calculation/integration operation. An operational amplifier or a high-precision resistor is not required for the switched capacitor. Thus, according to the present example of the invention, a high precision circuit can be implemented with a relatively simple circuit configuration.

The precision of an output signal is not dictated by the absolute capacitance value of the switched capacitor, but rather is dictated by the ratio among the respective capacitances of the plurality of capacitors included therein. For example, it is difficult to reduce the absolute error between the capacitances of two capacitors. However, it is possible in practice to change the area of the two capacitors (i.e., to change the area ratio between the capacitors) so as to improve the relative precision between the two capacitors. For example, the two capacitors can be provided on a semiconductor substrate, whereby the entire demodulation circuit can be implemented in a single LSI. Alternatively, the entire demodulation circuit can be implemented as one functional block in the LSI.

An operation of the gain controlling section 140 of FIG. 2 will now be described.

An amplitude signal output from the amplitude detection section 120 is input to the gate of the MOS transistor 141. As the amplitude of the amplified FM-IF signal increases, the current flowing through the MOS transistor 141 increases. Conversely, as the amplitude of the amplified FM-IF signal decreases, the current flowing through the MOS transistor 141 decreases.

The MOS transistors 104, 105, 143 and 144 together form a current mirror circuit, whereby the respective currents flowing through the MOS transistors 104, 105 and 144 change along with, and in proportion to, a change in the current flowing through the MOS transistor 141.

The MOS transistors 144, 145, 103, 108 and 109 also form a current mirror circuit. Therefore, when the current flowing though the MOS transistor 141 changes and the current flowing through the MOS transistor 144 changes, the respective currents flowing through the transistors also change in proportion to such changes. When the amplitude level of the FM-IF signal increases, and the amplitude of the output signal from the amplification section 100 increases, the output signal from the amplitude detection section 120 increases, thereby increasing the currents flowing through the MOS transistors 103, 104, 105, 108 and 109.

Then, the currents flowing through the MOS transistors 108 and 109 to be the loads for the first-stage folded cascode type differential amplifier of the amplification section 100 increase, thereby increasing mutual conductances GmL of the MOS transistors 108 and 109. Therefore, the gain of the differential amplifier decreases, thereby decreasing the amplitude of the output signal. This also prevents saturation of the MOS transistors 108 and 109 to be a load and thus prevents output signals of the MOS transistors 108 and 109 from being clipped.

On the other hand, when the amplitude level of the FM-IF signal decreases, and the amplitude of the output signal from the amplification section 100 decreases, the currents flowing through the MOS transistors 108 and 109 decrease, thereby decreasing the mutual conductances GmL of the MOS transistors 108 and 109. Accordingly, the gain of the differential amplifier increases, thereby increasing the amplitude of the output signal. By the above-described series of operations, the amplitude of the output signal from the amplification section 100 is kept at a constant level even when the amplitude of an FM-IF signal input to the amplification section 100 varies.

Thus, a stable FM-IF signal can be supplied to the digital frequency demodulation section 160 regardless of the input amplitude level.

Figure 5:
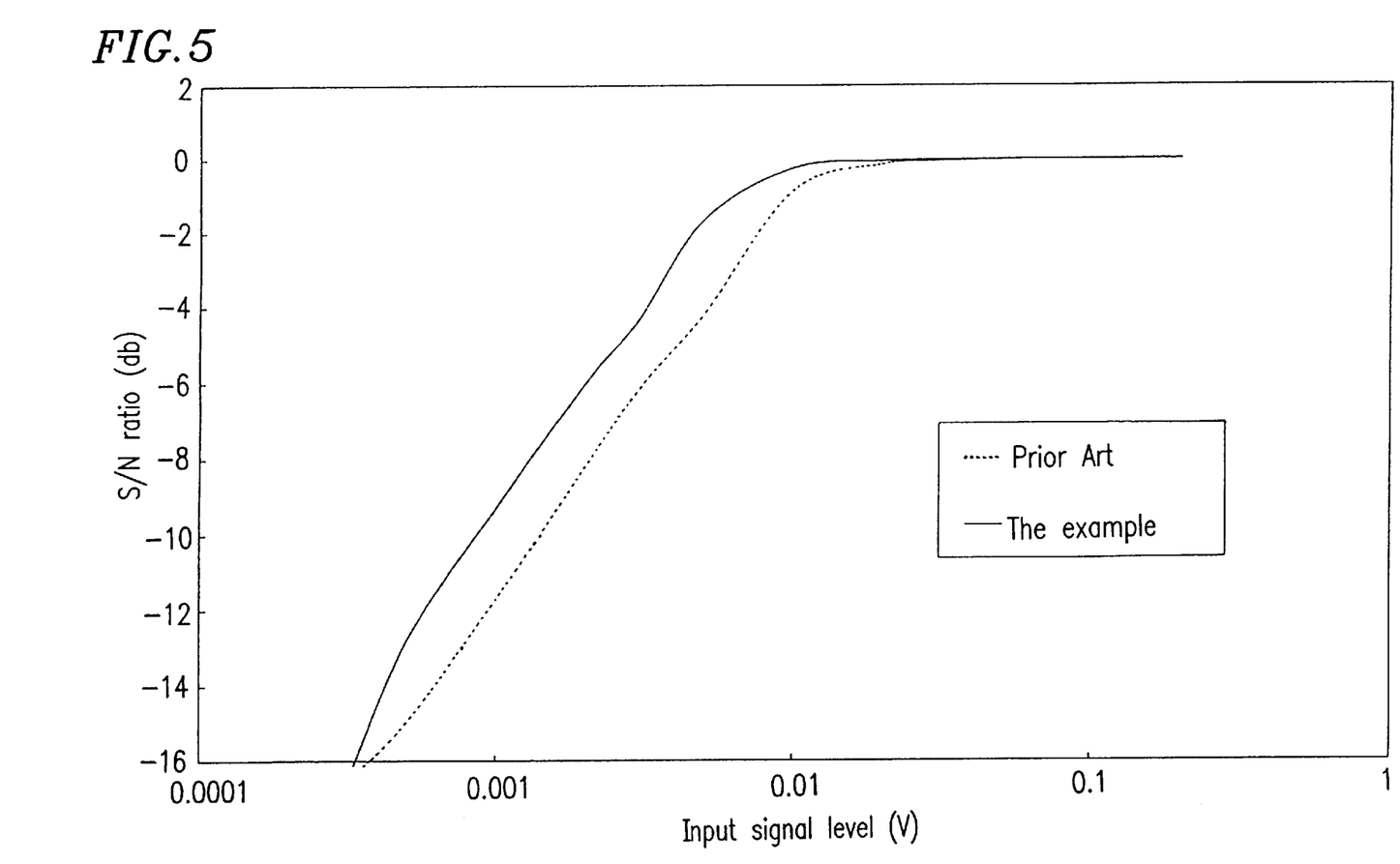
FIG. 5 illustrates simulation results showing a change in an S/N ratio of a frequency-demodulated signal with respect to a change in the level of an input signal, in comparison between a frequency demodulator according to the example of the present invention and a conventional frequency demodulator.

FIG. 5 illustrates simulation results showing a change in an S/N ratio of a frequency-demodulated signal with respect to a change in the level of an input signal, in comparison between the frequency demodulator according to the present example of the invention and the conventional frequency demodulator.

The frequency demodulator of the present example of the invention is capable of supplying a stable FM-IF signal to the digital frequency demodulation section 160 even when the amplitude of the received input signal varies. Thus, the frequency demodulator of the present example has an S/N ratio greater than that of the conventional frequency demodulator by 3 db or more for a low-level input signal.

Moreover, the frequency demodulator of the present example can accommodate a high-frequency FM-IF signal.

While the present example of the invention employs a digital delay detection device as the digital frequency demodulation section 160, the above-described effect can also be achieved when the digital delay detection device is replaced with any other suitable demodulation device such as a digital PLL detection device, or a coefficient type demodulation device.

The frequency demodulator of the present example comprises MOS transistors, capacitors, logic circuits, etc., and does not require an absolute precision in any component. Therefore, the frequency demodulator of the present example can easily be implemented in an LSI.

As described above, a frequency demodulator of the present invention includes: an amplification section for receiving a frequency-modulated signal and amplifying the signal based on a gain so as to produce a digital signal having a predetermined level; a digital demodulation section for receiving the digital signal and frequency-demodulating the digital signal; an amplitude detection section for receiving the digital signal and the inverted signal of the digital signal, and detecting maximum amplitude values of the digital signal and the inverted signal for a predetermined period of time so as to produce an amplitude signal in proportion to the maximum values; and a gain controlling section for varying the gain based on the amplitude signal. The gain of the amplification section is determined by the gain controlling section based on the magnitude of the amplitude detected by the amplitude detection section. Thus, the level of the digital signal is kept constant even when the level of the frequency-modulated signal input to the frequency demodulator varies.

Another frequency demodulator of the present invention includes: a differential amplifier for receiving a frequency-modulated signal and amplifying the frequency-modulated signal based on a gain so as to produce a digital signal and an inverted signal of the digital signal; a digital demodulation section for receiving the digital signal and frequency-demodulating the digital signal; an amplitude detection section having a switched capacitor section for detecting the digital signal and the inverted signal, and adding and integrating the signals by means of the switched capacitor section; and a gain controlling section for varying the gain by varying a bias current for the differential amplifier based on the signal obtained through the integration by the amplitude detection section. Thus, the level of the digital signal is kept constant even when the frequency-modulated signal input to the frequency demodulator varies.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A frequency demodulator, comprising:

an amplification section for receiving a frequency-modulated signal and amplifying the frequency-modulated signal based on a gain so as to produce a digital signal having a predetermined level and an inverted signal of the digital signal;

a digital demodulation section for receiving the digital signal and frequency-demodulating the digital signal;

an amplitude detection section for receiving the digital signal and the inverted signal of the digital signal, and detecting maximum amplitude values of the digital signal and the inverted signal for a predetermined period of time so as to produce an amplitude signal in proportion to the maximum values; and a gain controlling section for varying the gain based on the amplitude signal.

2. A frequency demodulator according to claim 1, wherein the digital demodulation section comprises:

a clock section for generating a clock signal;

a delay section for delaying the digital signal in synchronization with the clock signal;

a multiplication section for multiplying the digital signal and the delayed digital signal; and a digital filter for removing from the multiplied signal a signal in a band other than a band of the frequency-demodulated signal.

3. A frequency demodulator according to claim 1, wherein the amplification section, the digital demodulation section, the amplitude detection section, and the gain controlling section are all provided on a single semiconductor substrate.

4. A frequency demodulator, comprising:

a differential amplifier for receiving a frequency-modulated signal and amplifying the frequency-modulated signal based on a gain so as to produce a digital signal and an inverted signal of the digital signal;

a digital demodulation section for receiving the digital signal and frequency-demodulating the digital signal;

an amplitude detection section having a switched capacitor section for detecting the digital signal and the inverted signal, and adding and integrating the signals by means of the switched capacitor section; and a gain controlling section for varying the gain by varying a bias current for the differential amplifier based on the signal obtained through the integration by the amplitude detection section.

5. A frequency demodulator according to claim 4, wherein the differential amplifier, the digital demodulation section, the amplitude detection section, and the gain controlling section are all provided on a single semiconductor substrate.

* * * * *